(12) United States Patent
Lakhera et al.

(10) Patent No.: US 11,270,972 B2
(45) Date of Patent: Mar. 8, 2022

(54) PACKAGE WITH CONDUCTIVE UNDERFILL GROUND PLANE

(71) Applicant: NXP USA, Inc., Austin, TX (US)

(72) Inventors: Nishant Lakhera, Austin, TX (US); Akhilesh Kumar Singh, Austin, TX (US); Chee Seng Foong, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/438,546

(22) Filed: Jun. 12, 2019

(65) Prior Publication Data

US 2020/0395332 A1   Dec. 17, 2020

(51) Int. Cl.
*H01L 23/00*      (2006.01)
*H01L 23/498*    (2006.01)

(52) U.S. Cl.
CPC ........ *H01L 24/73* (2013.01); *H01L 23/49838* (2013.01); *H01L 24/13* (2013.01); *H01L 24/16* (2013.01); *H01L 24/32* (2013.01); *H01L 24/81* (2013.01); *H01L 24/83* (2013.01); *H01L 24/92* (2013.01); *H01L 2224/10152* (2013.01); *H01L 2224/1369* (2013.01); *H01L 2224/13562* (2013.01); *H01L 2224/16227* (2013.01); *H01L 2224/32227* (2013.01); *H01L 2224/73204* (2013.01); *H01L 2224/8102* (2013.01);
(Continued)

(58) Field of Classification Search
CPC ............. H01L 21/563; H01L 24/10–25; H01L 24/26–29; H01L 24/31–32; H01L 24/73; H01L 24/81; H01L 24/83; H01L 24/91–92; H01L 2224/1012; H01L 2224/10152; H01L 2224/13561; H01L 2224/13562; H01L 2224/1369; H01L 2224/2969; H01L 2224/32227; H01L 2224/73204; H01L 2224/8102; H01L 2224/92125
See application file for complete search history.

(56) References Cited

U.S. PATENT DOCUMENTS 5,869,886 A * 2/1999 Tokuno .................... H01L 24/29
                                                                257/678
6,297,562 B1 * 10/2001 Tilly ....................... H01L 24/16
                                                                257/738
(Continued)

OTHER PUBLICATIONS

Liu et al., "A First Individual Solder Joint Encapsulant Adhesive," Jul. 14, SEMICON West, 2010, 5 pages.
(Continued)

*Primary Examiner* — Aaron J Gray

(57) ABSTRACT

Embodiments for a packaged semiconductor device and methods of making are provided herein, which includes a packaged semiconductor device including: a semiconductor die; a carrier; a plurality of electrical connections formed between the semiconductor die and the carrier; an electrical isolation layer that covers an outer surface of each of the plurality of electrical connections; and a conductive underfill structure between the semiconductor die and the carrier, and surrounding each of the plurality of electrical connections, wherein the electrical isolation layer electrically isolates each electrical connection from the conductive underfill structure.

14 Claims, 7 Drawing Sheets

(52) U.S. Cl.
CPC ............... *H01L 2224/81815* (2013.01); *H01L 2224/83855* (2013.01); *H01L 2224/92125* (2013.01)

(56) References Cited

U.S. PATENT DOCUMENTS

| | | | | |
|---|---|---|---|---|
| 6,396,712 | B1* | 5/2002 | Kuijk | H01L 24/29 361/767 |
| 6,420,208 | B1* | 7/2002 | Pozder | H01L 23/50 257/738 |
| 7,338,842 | B2 | 3/2008 | Chaware et al. | |
| 9,793,237 | B2 | 10/2017 | Railkar et al. | |
| 2004/0149479 | A1 | 8/2004 | Chiu et al. | |
| 2007/0018322 | A1* | 1/2007 | Park | H01L 24/02 257/738 |
| 2011/0309481 | A1* | 12/2011 | Huang | H01L 24/13 257/659 |

OTHER PUBLICATIONS

Yincae.com, "Frequently Asked Questions," https://www.yincae.com/solder-joint-encapsulants.html, downloaded from the internet Jun. 11, 2019, 1 page.

* cited by examiner

PACKAGE WITH CONDUCTIVE UNDERFILL GROUND PLANE

BACKGROUND

Field

This disclosure relates generally to semiconductor packages, and more specifically, to semiconductor packages having a structure that protects external electrical connections while also providing a ground plane.

Related Art

Semiconductor packages are often attached to a carrier, such as a substrate or a printed circuit board (PCB), by a number of external connections, such as solder joints like solder balls arranged in a ball grid array (BGA). Typically, the coefficient of thermal expansion (CTE) of a package is different than the CTE of a carrier, where this difference creates mechanical stress on the external connections that attach the package to the carrier. To address this issue, underfill material is usually placed around solder joints between the package and the carrier to strengthen the attachment of the package to the carrier. The underfill material protects the solder joints by distributing various mechanical stresses away from the solder joints, such as those arising from thermal expansion, as well as from mechanical shocks or vibration. The underfill material generally minimizes breaks in the solder joints, improving the robustness of the solder joints.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

While underfill material is typically used to improve the robustness of solder joints between a package and a carrier, such underfill material is a dielectric or insulating material that fills the space in between solder joints. For example, solder balls with a diameter of 100 microns may have a solder ball pitch of 150 microns, leaving roughly 50 microns of dielectric material between and around each solder joint. This thick application of dielectric material around each solder joint may cause serious signal degradation in solder joints that convey a radio frequency (RF) signal between the package and the carrier. One approach to address RF signal degradation in RF applications, such as radar or wireless communication, is to avoid the use of underfill altogether and instead use an edge bond material around the edge of the package to strengthen the attachment of the package to the carrier. However, the edge bond material may similarly contact and surround solder joints located near the edge of the package. Since RF connections are often located around the edge of the package, the use of edge bond material may still result in RF signal degradation.

The present disclosure provides a conductive underfill structure around external electrical connections that protects external electrical connections of a package from mechanical stresses while also providing a ground plane for the external electrical connections. The external electrical connections between the package and the carrier are each surrounded by a dielectric encapsulant, forming an insulating barrier between each electrical connection and the conductive underfill structure. The underfill structure is formed from a conductive material, such as a conductive polymer underfill material, which may also include conductive fillers or particles for increased electrical conductivity. At least one ground pad, which is either on the carrier or on the package or both, is exposed to and electrically contacts the conductive underfill structure. The underfill structure is configured to convey an electrical charge to form a common ground plane around each external electrical connection. In various embodiments, the underfill structure electrically contacts more than one ground pad on the carrier, contacts more than one ground pad on the package, contacts a ground pad on both the carrier and the package, and any combination thereof. Since RF connections require good grounding, which is conventionally achieved by adding a metal layer on the carrier, implementing the present disclosure in a package with RF connections may allow such an extra metal layer to be removed from the carrier design, reducing the cost of materials and complexity of the carrier design.

Example Embodiments

Figure 1:
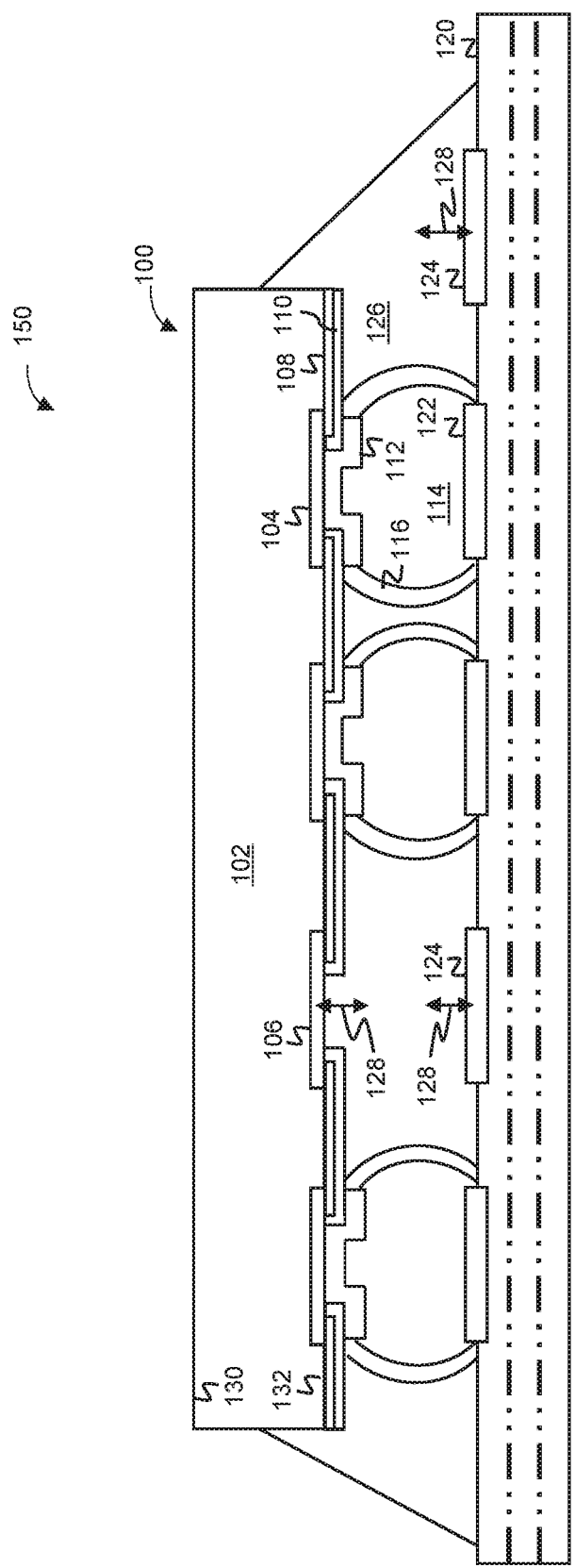
FIGS. 1 and 2 are block diagrams depicting example embodiments of packaged semiconductor devices that include an electrical isolation layer and a conductive underfill ground plane, according to some embodiments of the present disclosure.

FIG. 1 shows a cross-sectional view of an example semiconductor package 100 (also referred to as a packaged semiconductor device 100 or simply as package 100) attached to a carrier 120 with an underfill structure 126, resulting in a final packaged device 150. It is noted that the device shown in FIG. 1 and in each of the following drawings may each be representative of a single device or representative of one of a plurality of devices formed as part of a wafer or panel and then singulated into individual devices.

In the embodiment shown, package 100 is a chip scale packaging (CSP) package attached to a carrier 120, such as a printed circuit board (PCB) or a substrate, such as a laminate substrate or ceramic substrate, or another package. CSP packages generally have a package footprint equal to or less than 1.2 times the die footprint, and may have a pitch equal or less than 0.8 mm. While the following figures described herein show a wafer level CSP package, the teachings of the present disclosure may also be applicable to other package types, such as a fan out wafer level packaging (FOWLP) package, a ball grid array (BGA) package, or other package types that are otherwise configured to be attached by joints (e.g., solder balls, solder bumps such as C4 bumps, copper pillars, copper studs, or other conductive metal joints) to a suitable surface (e.g., a PCB, a substrate, an interposer, or another package). An example wafer level chip scale packaging (WLCSP) fabrication process for a package that includes formation of an underfill structure is discussed below beginning with FIG. 3.

Package 100 includes a semiconductor die 102 having a back side 130 of silicon (e.g., bulk silicon) and an opposite front side or active side 132 that includes active circuitry and a plurality of die pads connected to the active circuitry. Some (up to and including all) of the plurality of die pads are connected to a signal line of active circuitry that may carry either a radio frequency (RF) signal or may carry a non-RF signal, and are designated as die pads 104. RF signals have a frequency that generally falls within a range of 20 kHz to 300 GHz. Non-RF signals have a frequency that generally falls below 20 kHz, and may also include power supply signals. In some embodiments, one or more of the plurality of die pads on semiconductor die 102 are connected to a ground line of the active circuitry and are designated as a ground die pad 104 for electrical connection with the underfill structure 126, as further discussed below. The active circuitry of active side 132 may include circuitry configured to transmit or receive RF signals (e.g., an RF transmitter, an RF receiver, or both in an RF transceiver). In the embodiments shown herein, semiconductor die 102 is a flip chip die, having active side 132 in a face-down orientation toward the top surface of carrier 120. Also in the embodiment shown, back side 130 of the die 102 also forms the back side of the package 100, although the back side of the package 100 may extend beyond the back side of the die 102 in other embodiments (e.g., embodiments with mold compound around the back side 130 of the die 102 like that shown in FIG. 14).

Semiconductor die 102 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, MEMS (microelectromechanical systems) device, a stand-alone discrete device such as a resistor, inductor, capacitor, diode, power transistor, and the like.

It is noted that in some embodiments, the active circuitry of die 102 may include a radio frequency (RF) block that implements an RF transmitter, an RF receiver, or both. In some embodiments, RF signals may be transmitted, received, or both, via an antenna on the resulting device (e.g., on carrier 120) that is communicatively coupled to the active circuitry of die 102 (e.g., through one or more external electrical connections between die 102 and carrier 120). The RF block may implement front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front end components of the RF block may have configurable settings to adjust the output signal that conveys the sensor data. In some embodiments, the RF block may have an operating frequency that falls within a frequency band of 300 to 500 MHz, although other operating frequencies that fall within other radio frequencies may be implemented in other embodiments.

Figure 3:
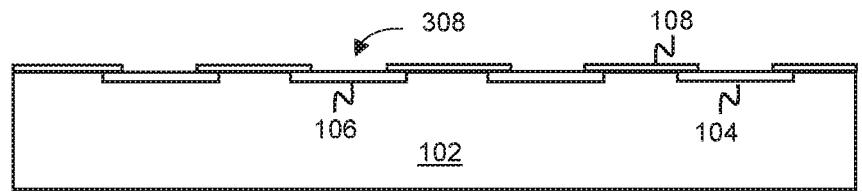
FIGS. 3, 4, 5, 6, 7, 8, and 9 are block diagrams depicting an example device fabrication process that includes steps for forming an electrical isolation layer and a conductive underfill ground plane, according to some embodiments of the present disclosure.

Passivation layer 108 is a dielectric material that is formed over the active side 132 of die 102, with openings in the layer 108 to expose surfaces of the die pads 104 and 106 (shown as openings 308 in FIG. 3). Examples of materials used for passivation layer 108 include but are not limited to silicon nitride, silicon dioxide, silicon oxynitride, polyimide, and other suitable dielectric materials. Repassivation layer 110 is a dielectric material that is formed over passivation layer 108 on the active side 132 and within the openings in layer 108 (shown as openings 410 in FIG. 4). Additional openings in repassivation layer 110 expose surfaces of the die pads 104 and 106, which openings may be smaller in diameter than the openings in the layer 108. In some embodiments, repassivation layer 110 may be formed as part of a redistribution layer (RDL) structure formed on the active side of the die 102 (e.g., like layer 1410 shown in FIG. 14). In some embodiments, the RDL structure may be formed over each die 102 implemented in a wafer of dies or implemented as a panel of dies embedded in mold compound or other suitable material, where the wafer or panel is singulated into a plurality of devices. Repassivation layer 110 may be formed from a polymer dielectric material, examples of which include but are not limited to polybenzoxazole (PBO), benzocyclobutene (BCB), polyimide, photo sensitive polyimide, and other suitable polymer dielectric materials.

Passivation layer 108 and repassivation layer 110, as well as an RDL structure, may be formed using a sequence of numerous process steps applied to the semiconductor die 102, to a wafer of die 102, or to a panel of embedded die 102. Such process steps include but are not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like.

Under bump metallization (UBM) 112 are formed within each opening of repassivation layer 110 directly and electrically contacting the surfaces of die pads 104 (e.g., the surfaces exposed through both the passivation layer 108 and repassivation layer 110). UBM 112 are formed from a thin film stack of one or more electrically conductive metals, examples of which include but are not limited to nickel, gold, copper, aluminum, titanium, tungsten, chromium, palladium, or other suitable conductive metal or alloy composed of one or more suitable conductive metals. UBM 112 provide wettability and proper adhesion of joints (such as solder bumps, described below). For example, in some embodiments, UBM 112 may be formed using an electroless plating process to form a stack of nickel, palladium, and gold in a "mushroom" shape having edges that overlap the repassivation layer 110.

A plurality of joints 114 are formed, where each joint 114 is attached and electrically connected to a respective UBM 112. In the embodiment shown, the joints 114 are solder bumps. Each joint 114 is electrically connected through UBM 112 to a die pad 104 to a respective signal line, which may be either an RF signal or a non-RF signal. In other embodiments, the joints 114 may be implemented as solder balls, copper pillars, copper studs, or other suitable conductive metal joints.

As noted above, die pad 106 is a ground die pad for electrical connection with the underfill structure 126, meaning that a joint 114 is not formed on die pad 106. Underfill structure 126 directly contacts and electrically connects to ground die pad 106, where the electrical connection at the interface between the ground die pad 106 and the underfill structure 126 is shown as a double headed arrow 128 (where the underfill structure 126 is discussed below). In the embodiment shown, UBM 112 is absent from die pad 106 since a joint 114 will not be electrically connected to die pad 106.

Figure 2:
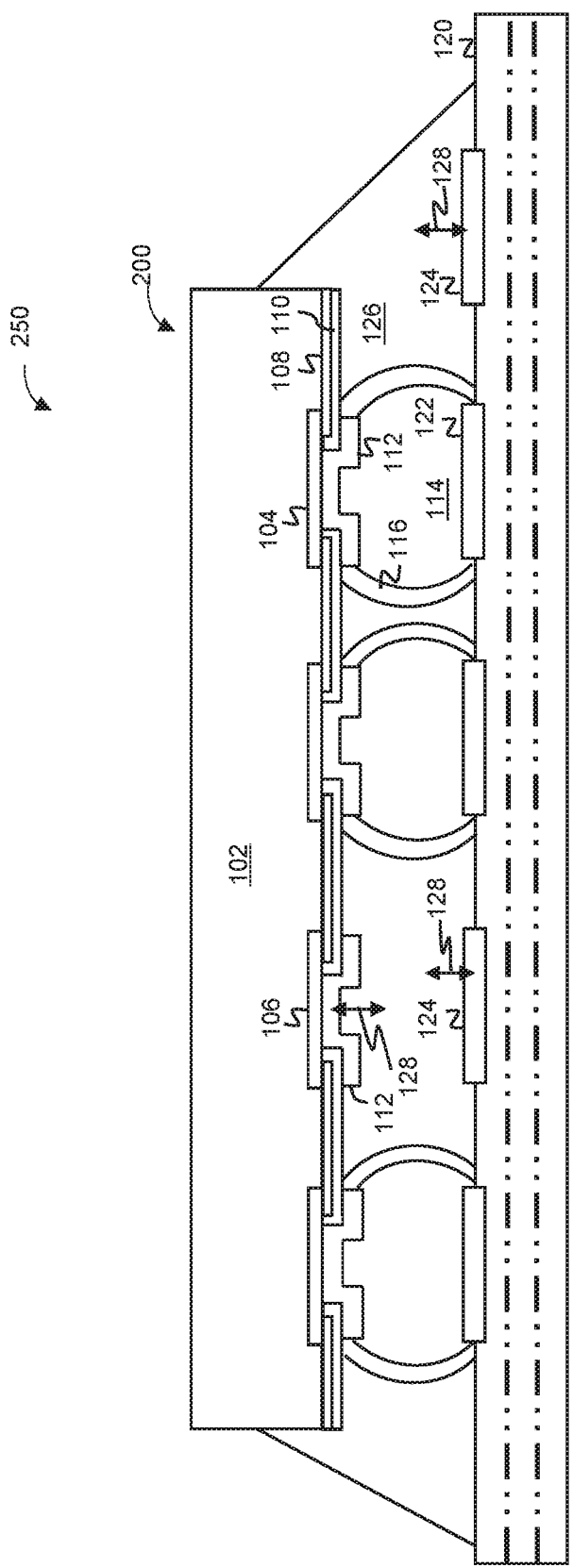

In other embodiments, UBM 112 may be formed on die pad 106, although a joint 114 is not formed on UBM 112 of die pad 106. For example, FIG. 2 shows a cross-sectional view of an example semiconductor package 200 (also referred to as a packaged semiconductor device 200 or simply as package 200) attached to a carrier 120 with an underfill structure 126, resulting in a final packaged device 250. Package 200 includes semiconductor die 102 with die pads 104 and 106, with UBM 112 on all die pads 104 and 106. In such embodiments, joints 114 are attached to UBM 112 on die pads 104, while the UBM 112 on die pad 106 lacks a joint 114 in order to expose UBM 112 to the underfill structure 126. Underfill structure 126 directly contacts and electrically connects to UBM 112 of die pad 106, as shown by double headed arrow 128 in FIG. 2. It may be beneficial in such embodiments to keep the same (uniform) number of UBM 112 implemented in the package in order to reduce complexity of the design.

Returning to FIG. 1, carrier 120 includes a plurality of landing pads, some (up to and including all) of which are electrically connected to RF and non-RF signal lines, including power signal lines, and are designated as landing pads 122. In some embodiments, one or more landing pads of the plurality of landing pads on carrier 120 are connected to a ground line and are designated as a ground landing pad 124 for electrical connection with the underfill structure 126, as further discussed below. Joints 114 are attached to landing pads 122 on the carrier 120, forming a plurality of external electrical connections between the package 100 and the carrier 120. The joints 114 are both electrically connected to the carrier 120 and provide mechanical attachment of the package 100 to the carrier 120. In this manner, each landing pad 122 is electrically connected to a respective pad. Similar to ground die pad 106, a joint 114 is not attached to ground landing pad 124. In some embodiments, it is preferred that at least one ground landing pad 124 be electrically connected to underfill structure 126, which may provide a more robust ground connection than a ground die pad 106. The top surface of carrier 120 that includes landing pads 122 and 124 also includes a passivated surface, or a layer of passivation through which the top surfaces of landing pads 122 and 124 are exposed (not shown for simplicity's sake, but similar to the passivation 108 and 110 of die 102 through which pads 104 and 106 are exposed).

In some embodiments, carrier 120 may be a printed circuit board (PCB) that includes electrically conductive features such as traces and pads (e.g., landing pads 122 and 124) on a non-conductive substrate. A PCB may be a flexible type PCB using polyimide or a rigid type PCB using FR4 or BT resin. In other embodiments, carrier 120 may be a laminate substrate, which is made of a number of dielectric material layers and electrically conductive material layers to form electrically conductive structures through the substrate, which include traces, pads (e.g., landing pads 122 and 124), interconnects, and vias. In other embodiments, carrier 120 may be a ceramic substrate including a ceramic core with electrically conductive features such as traces and pads (e.g., landing pads 122 and 124) bonded to the ceramic core. In other embodiments, carrier 120 may be another package having a number of landing pads 122 and 124, which may result in a package on package (POP) device.

Conductive structures (e.g., traces, pads, interconnects, vias) that are formed as part of die 102 or carrier 120 (or an RDL structure like that shown in FIG. 14) are formed from an electrically conductive material, examples of which include but are not limited to nickel, gold, copper, aluminum, or other suitable conductive metal or alloy composed of one or more suitable conductive metals. The pads 104 and 106 on die 102 and the pads 122 and 124 on carrier 120 may also be coated with an electrically conductive material, examples of which include nickel, gold, copper, aluminum, tin, silver, titanium, or other suitable conductive metal or alloy composed of one or more suitable conductive metals in order to improve the "bondable" nature of the pad.

Each external electrical connection is electrically isolated from underfill structure 126 by a thin layer of dielectric encapsulant 116, which may also be referred to as an electrical isolation layer 116. The thickness of dielectric encapsulant 116 may be on the order of microns, such as 5 to 10 microns, which is much thinner than compared with the thickness of traditional dielectric underfill material surrounding each joint 114, for example on the order of 50 to 100 microns. The dielectric encapsulant 116 serves as an insulating barrier and should completely encapsulate each external electrical connection, which includes directly contacting and covering all exposed surfaces of each joint 114, as well as any exposed surface of UBM 112 and landing pad 122 (e.g., also covers lateral edges of UBM 112 and landing pad 122 that may not be covered by joint 114). Dielectric encapsulant 116 is not applied to ground die pads 106 or to ground landing pads 124. Application of the dielectric encapsulant 116 to each external electrical connection is further discussed below in connection with FIG. 7-8 and FIG. 10-12.

Underfill structure 126 is an electrically conductive structure that fills the space between die 102 and carrier 120 and surrounds the electrical isolation layer 116 of each external electrical connection. At least one ground landing pad 124 on the carrier 120 or at least one ground die pad 106 or UBM 112 on the package 100, or both, is exposed to and makes contact with the underfill structure 126. Underfill structure 126 electrically contacts the surface of any exposed ground pad, conveying an electrical charge (e.g., ground) throughout the underfill structure 126. For example, FIG. 1 shows the underfill structure 126 electrically contacting at least a die pad 106 and two landing pads 124, where the electrical connection between the surfaces of the three pads and the underfill structure 126 is shown as a double headed arrow 128. In this manner, underfill structure 126 provides mechanical support for improved robustness of joints 114, as well as a common ground plane around all joints 114, whether those joints 114 are configured to carry RF or non-RF signals, for improved RF performance. Other embodiments may implement fewer or different electrical connections 128 with the underfill structure 126. Formation of underfill structure 126 is further discussed below in connection with FIG. 9.

FIG. 3-9 show cross-sectional views of an example device fabrication process for forming at least one electrical isolation layer around a respective external electrical connection and a conductive underfill ground plane. While a semiconductor die 102 is shown as a representative device in the following figures, a die 102 surrounded by a package body (e.g., like die 102 surrounded by mold compound that forms package body 1402 in FIG. 14) may be implemented in other embodiments.

FIG. 3 shows a semiconductor die 102 in an active side face-up orientation, with a set of die pads 104. In the embodiment shown, die 102 also includes a ground die pad 106, which is designated for electrical connection with the underfill structure 126 (later shown in FIG. 9). In other embodiments, die 102 may not include any ground die pads 106 designated for electrical connection with underfill structure 126, where the carrier 120 includes such designated ground landing pads 124. A passivation layer 108 has been conformally formed over the active side of die 102, with a plurality of openings 308 through passivation layer 108 exposing surfaces of each of the set of die pads 104 and the at least one ground die pad 106.

Figure 4:
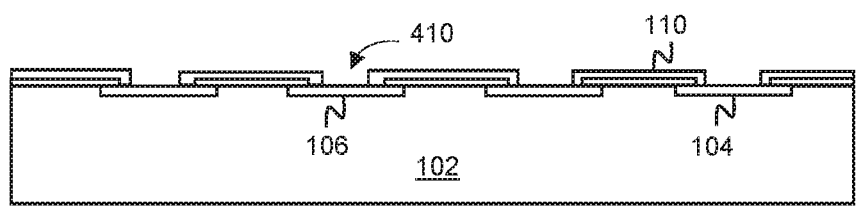

FIG. 4 shows semiconductor die 102 after a repassivation layer 110 has been conformally formed over the active side of die 102, directly contacting passivation layer 108. A plurality of openings 410 through repassivation layer 110 expose surfaces of each of the set of die pads 104 and any ground die pads 106 (if designated). The openings 410 may have a smaller diameter than the openings 308.

Figure 5:
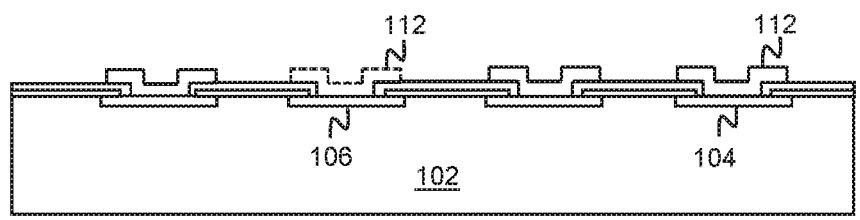
Figure 15:
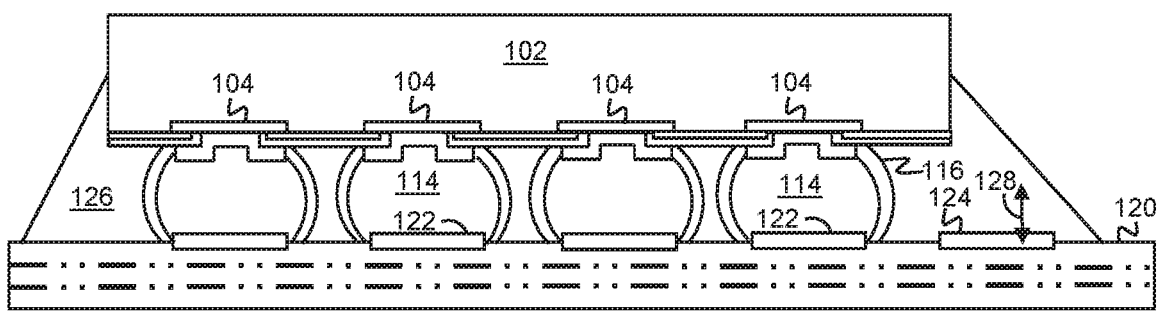
Figure 16:
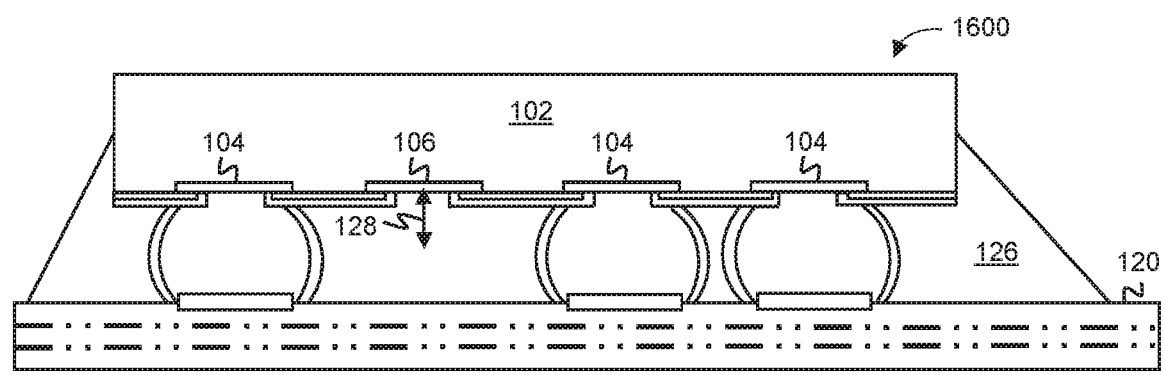

FIG. 5 shows semiconductor die 102 after UBM 112 is formed on each exposed surface of die pads 104. In the embodiment shown, UBM 112 is not formed on any ground die pads 106. In other embodiments, UBM 112 may be optionally formed on each exposed surface of ground die pads 106, which is shown as UBM 112 in dashed outline. In such embodiments, it may be beneficial to form UBM 112 on all pads of die 102 in a uniform manner (e.g., using a UBM process performed in parallel on all pads), where a device having UBM 112 on all pads of die 102 is further shown in FIG. 10. In other embodiments, die 102 may not include any UBM 112 on any die pads, which skips the UBM process step shown in FIG. 5 to maintain a uniform device fabrication process (e.g., no UBM process is performed on any pads), where a resulting device having omitted UBM 112 is shown in FIG. 16. In still other embodiments, die 102 may not include any ground die pads 106 (e.g., the carrier 120 includes ground landing pads 124), in which case UBM 112 is formed on all pads of die 102 (since die 102 only includes die pads 104 in such case), where a resulting device having no ground die pads 106 is shown in FIG. 15.

Figure 6:
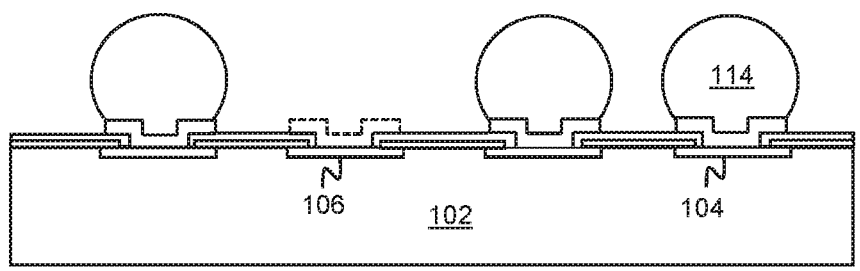

FIG. 6 shows semiconductor die 102 after joints 114 are formed on UBM 112 that are respectively formed on die pads 104. Joints 114 are not formed on UBM 112 that are formed on ground pads 106 on the die 102 (e.g., in embodiments where UBM 112 is present on ground pads 106). In embodiments where UBM 112 is omitted from all pads (e.g., UBM 112 is not formed on any die pads 104 or ground pads 106), joints 114 are formed directly only on die pads 104, leaving ground pads 106 exposed. In still other embodiments, die 102 may not include any ground die pads 106 (e.g., the carrier 120 includes ground landing pads 124), in which case joints 114 may be formed on all UBM 112 on all pads of die 102 (since die 102 only includes die pads 104 in such case).

Figure 7:
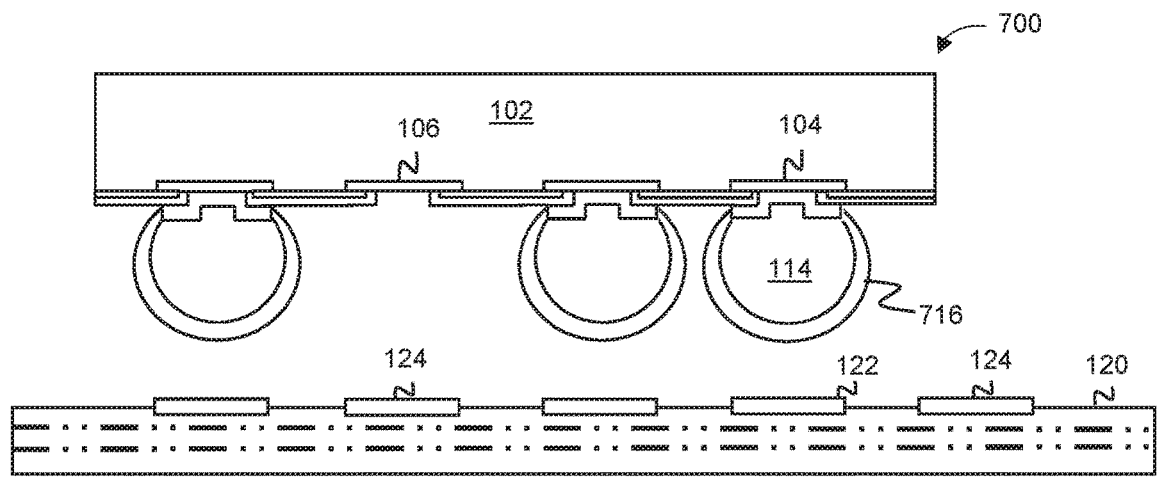

FIG. 7 shows semiconductor die 102 in an active side face-down orientation after application of dielectric encapsulant to joints 114, which may also be referred to as device 700. In the embodiment shown, device 700 includes at least one ground pad 106 that lacks UBM 112 and joint 114. FIG. 7 also shows carrier 120, where joints 114 of device 700 are aligned to landing pads 122. In the embodiment shown, carrier 120 also includes one or more ground landing pads 124. In other embodiments that include at least one ground pad 106 on die 102, carrier 120 may not include any ground landing pads 124, such as the resulting device having no ground landing pads 124 shown in FIG. 16.

In the embodiment shown in FIG. 7, dielectric encapsulant 716 is a polymer dielectric material in a viscous form (also referred to as viscous encapsulant 716). Viscous encapsulant 716 may be a paste, thick liquid, or similar form with a viscosity that allows a sufficient amount of the encapsulant 716 to adhere to the joint 114 during application, such as by brushing the joints 114 with the viscous encapsulant 716 or dipping the joints 114 into the viscous encapsulant 716. The encapsulant 716 need not completely cover the joint 114 at this step, since the encapsulant 716 implements a wetting function, as discussed below. Another encapsulant application approach is discussed below in connection with FIG. 10-12.

Figure 8:
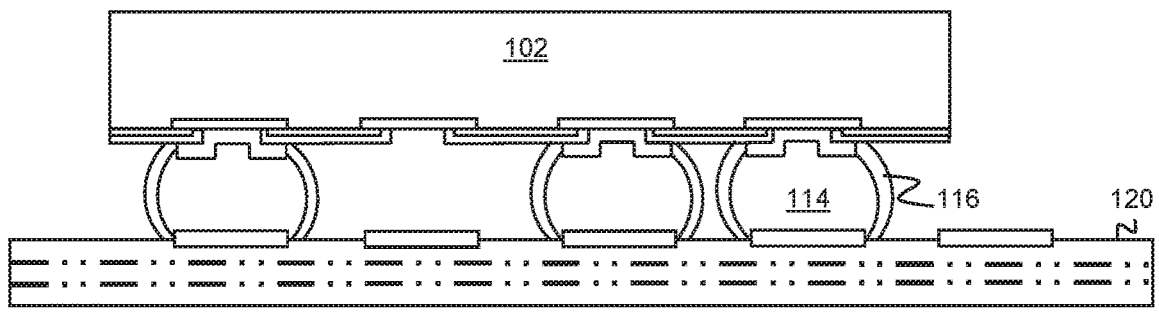

FIG. 8 shows semiconductor die 102 after joints 114 are attached to a set of landing pads 122 of carrier 120. In the embodiment shown, the device 700 may be placed on carrier 120, with joints 114 positioned on respective landing pads 122. A reflow process is performed, where the device 700 is exposed to a predetermined temperature excursion (e.g., a range of temperatures for some amount of time) that sufficiently melts the joints 114. Also during reflow, the viscous encapsulant 716 implements a flux function that allows the encapsulant 716 to wick away from the interface between a given joint 114 and a respective landing pad 122, allowing the joint 114 to collapse onto the top surface of the landing pad 122. The viscous encapsulant 716 also implements a wetting function that allows the encapsulant 716 to wet or wick along the outer surface of joint 114 up to the passivated surface of die 102 and down to the passivated surface of carrier 120 to completely cover joint 114. In some embodiments, the viscous encapsulant 716 may begin to cure (e.g., viscosity of the encapsulant 716 increases) during the temperature excursion. The reflow temperature excursion is implemented such that the encapsulant 716 does not fully cure into encapsulant 116 until after the joint 114 has collapsed onto the landing pad 122. The temperature is then reduced to allow joints 114 to solidify for permanent attachment at the interface between each joint 114 and the respective landing pad 122, with a resulting solid or high viscosity form of dielectric encapsulant 116 formed around each joint 114.

In some embodiments, the joint 114 may fully cover die pad 104 and landing pad 122, in which case the cured dielectric encapsulant 116 forms an electrical isolation layer 116 by completely covering the joint 114. In other embodiments, lateral edges of UBM 112 and landing pad 122 may not be completely covered by joint 114, and may or may not be covered by any dielectric layers like passivation 108 and repassivation 110. In such embodiments, during reflow, the viscous encapsulant 716 wicks along the outer surface of the joint 114 and onto the exposed metal surfaces of UBM 112 and landing pad 122, completely covering the any exposed surfaces of the electrical connection formed by UBM 112, joint 114, and landing pad 122.

Figure 9:
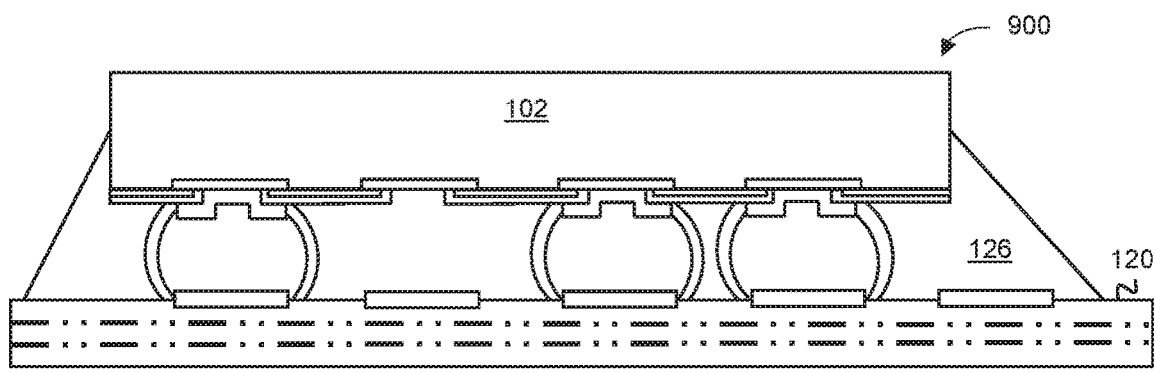

FIG. 9 shows semiconductor die 102 after underfill structure 126 is formed, resulting in device 900. Underfill structure 126 is formed from a conductive polymer underfill material. In some embodiments, the underfill material may further include conductive fillers or particles distributed throughout the underfill material to increase electrical conductivity. While in a low viscosity form, the underfill material may be injected in the space between die 102 and carrier 120, and in between joints 114 coated in dielectric encapsulant 116 (also referred to as the electrical isolation layer 116). In the embodiment shown, ground die pad 106 and ground landing pads 124 are exposed to and are directly contacted by the underfill material. The underfill material is then cured into the underfill structure 126, which attaches to a portion of the active side of die 102, to electrical isolation layer 116 of each joint 114, and to a portion of the top surface of carrier 120. Underfill structure 126 is mechanically rigid to provide mechanical support for the joints 114. The conductive fillers or particles within the underfill structure 126 make electrical contact with the surface of the exposed ground die pad 106 and ground landing pads 124, and convey an electrical charge (e.g., ground) throughout the underfill structure 126, providing a common ground plane around each of the joints 114.

Examples of conductive polymer underfill material include but are not limited to trans-polyacetylene and the like, which have electrical conductivities comparable to conductive metals materials (e.g., $6 \times 10^5$ Siemens/cm). A suitable electrical conductivity of a conductive polymer underfill material may be equal to or greater than $1 \times 10^5$. Examples of conductive fillers or particles include but are not limited to fillers or particles formed from copper, aluminum, silver, or other suitable conductive metal or alloy composed of one or more suitable conductive metals. A suitable electrical conductivity of a conductive polymer underfill material with conductive filler or particles may be equal to or greater than $1 \times 10^6$.

Figure 10:
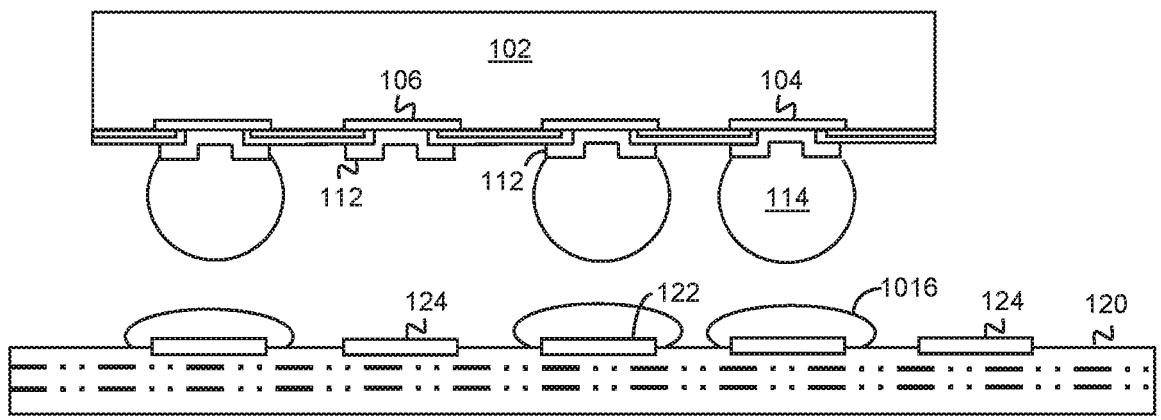
FIGS. 10, 11, and 12 are block diagrams depicting alternative process steps for forming an electrical isolation layer, according to some embodiments of the present disclosure.
Figure 11:
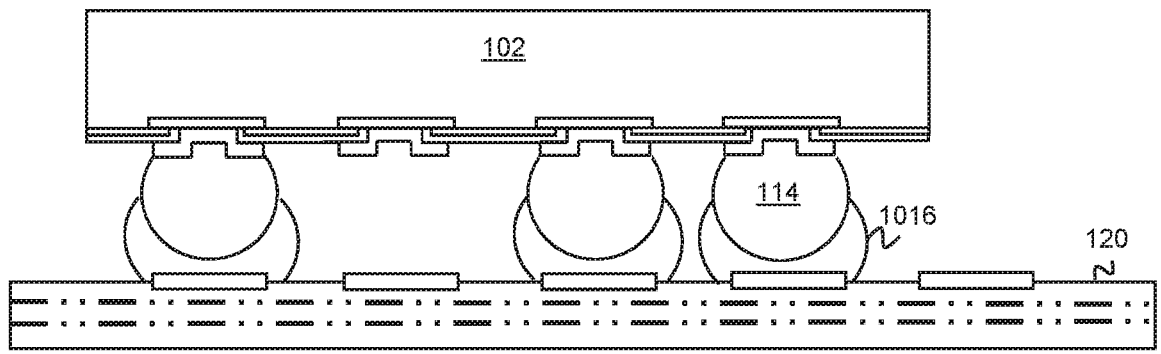
Figure 12:
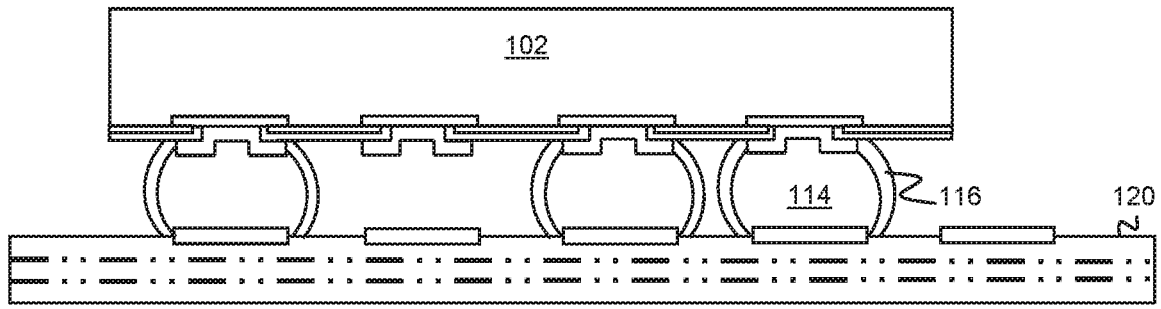

FIG. 10-12 show an alternative encapsulant application approach, which applies the dielectric encapsulant to landing pads on the carrier 120 rather than the joints 114. FIG. 10 shows semiconductor die 102 in an active side face-down orientation, with at least one ground pad 106 that includes UBM 112, but lacks a joint 114 on that UBM 112. FIG. 10 also shows carrier 120, after application of dielectric encapsulant 1016 to landing pads 122. In the embodiment shown, dielectric encapsulant 1016 is a polymer dielectric material in a viscous form (also referred to as viscous encapsulant 1016). Viscous encapsulant 1016 may be a paste, thick liquid, or similar form with a viscosity that allows a sufficient amount of the encapsulant 1016 to adhere to each landing pad 122 during application, such as by jetting, printing, or otherwise coating the viscous encapsulant 1016 onto the landing pads 122, with minimal runoff of the encapsulant 1016 onto the top surface of the carrier 120. Also in the embodiment shown, carrier 120 also includes one or more ground landing pads 124, which are not coated with the viscous encapsulant 1016. In other embodiments that include at least one ground pad 106 on die 102, carrier 120 may not include any ground landing pads 124.

FIG. 11 shows joints 114 collapsing toward landing pads 122 of carrier 120 during a reflow process. For example, the joints 114 may be positioned on the viscous encapsulant 1016 on landing pads 122. A reflow process is performed, which exposes joints 114 to a predetermined temperature excursion that sufficiently melts the joints 114. Also during reflow, the viscous encapsulant 1016 implements a flux function, which is shown in FIG. 11. The viscous encapsulant 1016 wicks away from the interface between a given joint 114 and a respective landing pad 122, allowing the joint 114 to collapse onto the top surface of the landing pad 122. FIG. 11 also shows viscous encapsulant 1016 wicking up along the outer surface of joint 114, eventually completely covering the outer surface of joint 114. In some embodiments, viscous encapsulant 1016 continues to wick up along any exposed metal surfaces of UBM 112 and landing pad 122, completely covering the electrical connection formed between UBM 112 and landing pad 122 (which is also to say the electrical connection formed between die 102 and carrier 120), which is shown in FIG. 12. In some embodiments, the viscous encapsulant 1016 may begin to cure (e.g., viscosity of the encapsulant 1016 increases) during the temperature excursion. The reflow temperature excursion is implemented such that the encapsulant 1016 does not fully cure into encapsulant 116 until after the joint 114 has collapsed onto the landing pad 122.

FIG. 12 shows joints 114 collapsed onto landing pads 122 after the temperature excursion, where the temperature is reduced to allow joints 114 to solidify for permanent attachment at the interface between each joint 114 and the respective landing pad 122. Also, the viscous encapsulant 1016 has been cured into a solid or high viscosity form of dielectric encapsulant 116 surrounding each joint 114. The process may continue to FIG. 9, where the underfill structure 126 is formed, as discussed above.

Figure 13:
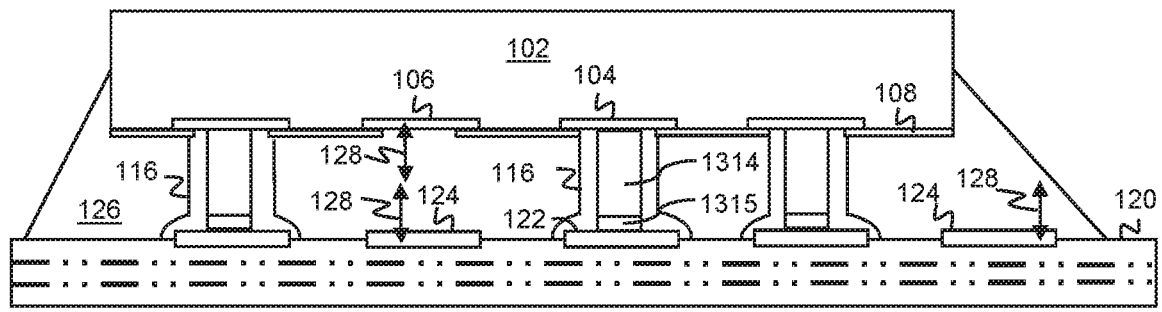
FIGS. 13, 14, 15, and 16 are block diagrams depicting additional example embodiments of packaged semiconductor devices that include an electrical isolation layer and a conductive underfill ground plane, according to some embodiments of the present disclosure.

FIG. 13-16 show other example embodiments utilizing the teachings of the present disclosure to implement an underfill structure 126, which is isolated from any external electrical connections by an electrical isolation layer 116. FIG. 13 shows an embodiment where joints 114 are implemented as copper pillars 1314 formed on die pads 104. A solder cap 1315 may also be included on copper pillars 1314. Prior to reflow, viscous encapsulant is applied. In some embodiments, viscous encapsulant may be applied to the copper pillars 1314 with solder caps 1315 (like dipping or brushing, as discussed above in connection with FIG. 7), while in other embodiments, viscous encapsulant may be applied to landing pads 122 on carrier 120 (like jetting or printing, as discussed above in connection with FIG. 10). During reflow, viscous encapsulant wicks away from the interface between the solder cap 1315 and landing pad 122, allowing solder cap 1315 to melt onto landing pad 122 and form a connection. Viscous encapsulant also wicks up along the outer surfaces of solder cap 1315 and copper pillar 1314 during reflow. In some embodiments, a portion of die pad 104 is exposed around copper pillar 1314, where viscous encapsulant wicks along and covers the exposed metal surface of die pad 104. Also during reflow, viscous encapsulant is cured into dielectric encapsulant 116, which forms electrical isolation layer 116 around each electrical connection between die 102 and carrier 120, which completely covers any exposed surfaces of die pad 104, copper pillar 1314, solder cap 1315, and landing pad 122.

Figure 14:
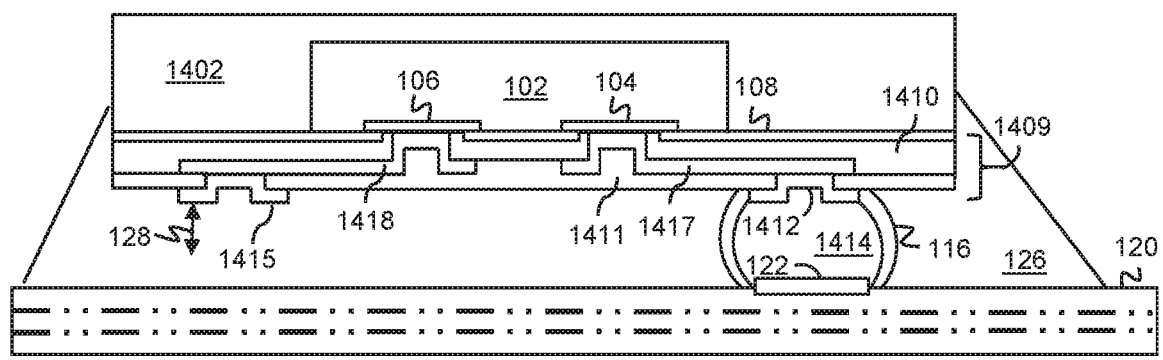

FIG. 14 shows a fan out wafer level packaging (FOWLP) embodiment. In the embodiment shown, die 102 is embedded in package body 1402 and includes at least one die pad 104 and at least one ground die pad 106. In some embodiments, package body 1402 is made of an encapsulant material such as a mold compound based on a biphenyl type or multi-aromatic type epoxy resin, but may be other types of encapsulating materials in other embodiments. The encapsulating may be performed by an encapsulating method, such as transfer molding, film assisted molding, glob top, dam and fill, underfill, lamination, or other types of other encapsulating methods.

A redistribution layer (RDL) structure 1409 is formed over the active side of the device formed by embedded die 102 and package body 1402. RDL structure 1409 includes a number of patterned dielectric layers and metal layers, which form routing or connection paths through the RDL structure 1409, like traces 1417 and 1418 surrounded by dielectric layers 1410 and 1411. Traces 1417 and 1418 provide electrical connection paths between the die pads 104 and 106 on the die 102 and a plurality of external contact pads 1412 and 1415 at an outermost surface of the RDL structure 1409. In the embodiment shown, contact pads 1412 and 1415 are also formed using a thin metal stack like UBM 112, described above. As shown, trace 1417 makes electrical contact with die pad 104 at one end and with a respective contact pad 1412 at the other end, while trace 1418 makes electrical contact with ground die pad 106 at one end and with contact pad 1415 at the other end. In the embodiment shown, contact pad 1415 makes electrical connection with underfill structure 126, as shown by double headed arrow 128. In other embodiments, contact pad 1415 may be omitted, leaving a portion of trace 1418 exposed for electrical connection to underfill structure 126, in a manner similar to UBM 112 omitted in FIG. 1, which leaves ground die pad 106 exposed for electrical connection to underfill structure 126. While FIG. 14 shows simple connection paths, the patterned dielectric layers and metal layers may be repeated to create complex routing or connection paths through the RDL structure 1409. Joints 114 are implemented as solder balls 1414 in the embodiment shown, with an electrical isolation layer 116 that completely covers each solder ball 1414 and any exposed surfaces of contact pad 1412 and landing pad 122. It is noted that, in the embodiment shown, no landing pads 124 are electrically connected to underfill structure 126.

FIG. 15 shows another example CSP embodiment, where at least one landing pad 124 is electrically connected to underfill structure 126, while no pads on die 102 are designated as ground pads 106. As shown, die 102 has a plurality of pads 104, each pad 104 having an external electrical connection formed to carrier 120 through UBM 112, joint 114, and landing pad 122. Each external electrical connection is completely covered by an electrical isolation layer 116, which isolates the external electrical connections from underfill structure 126. As noted above, landing pads 124 may provide a more robust ground connection for underfill structure 126, due to the capacity of the landing pad 124 comparable to ground die pads 106 (e.g., due to the larger ground pad size or larger ground wire size of the carrier 120 compared to the die 102).

FIG. 16 shows another example CSP embodiment, where UBM 112 is omitted from all pads on the die 102 (e.g., none of the pads on the die 102 have UBM 112). Joints 114 are formed directly on pads 104, while joint 114 is omitted from ground pad 106. Underfill structure 126 directly contacts and electrically connects to ground die pad 106, where the electrical connection at the interface between the ground die pad 106 and the underfill structure 126 is shown as a double headed arrow 128. In the embodiment shown, the die 102 is providing the ground connection through ground die pad 106 without having a ground landing pad 124 on carrier 120.

By now it should be appreciated that there has been provided a conductive underfill structure around external electrical connections that protects external electrical connections of a package from mechanical stresses while also providing a ground plane for the external electrical connections. The underfill structure is formed from a conductive material, such as a conductive polymer underfill material, which may also include conductive fillers or particles for increased electrical conductivity. At least one ground pad, which is either on the carrier or on the package or both, is exposed to and electrically contacts the conductive underfill structure to form a common ground plane around each external electrical connection.

In one embodiment of the present disclosure, a packaged semiconductor device is provided, which includes: a semiconductor die; a carrier; a plurality of electrical connections formed between the semiconductor die and the carrier; an electrical isolation layer that covers an outer surface of each of the plurality of electrical connections; and a conductive underfill structure between the semiconductor die and the carrier, and surrounding each of the plurality of electrical connections, wherein the electrical isolation layer electrically isolates each electrical connection from the conductive underfill structure.

One aspect of the above embodiment provides that the semiconductor die includes a plurality of die pads connected to active circuitry within the semiconductor die.

A further aspect of the above embodiment provides that each electrical connection of the plurality of electrical connections includes: under bump metallization (UBM) formed on each of a set of the plurality of die pads, and a plurality of joints formed on the UBM of the set of the plurality of die pads Another further aspect of the above embodiment provides that each electrical connection of the plurality of electrical connections includes: a plurality of joints formed on the set of the plurality of die pads.

Another further aspect of the above embodiment provides that at least one of the plurality of die pads is a ground die pad connected to a ground line, and the conductive underfill structure directly contacts and is electrically connected to the ground die pad.

Another further aspect of the above embodiment provides that at least one of the plurality of die pads is a ground die pad connected to a ground line, under bump metallization (UBM) is formed on the ground die pad, and the conductive underfill structure directly contacts and is electrically connected to the UBM.

Another further aspect of the above embodiment provides that each electrical connection of the plurality of electrical connections includes: a copper pillar formed on each of a set of the plurality of die pads, and a solder cap formed on each copper pillar.

Another aspect of the above embodiment provides that the carrier includes a plurality of landing pads, and the plurality of electrical connections are attached to a set of the plurality of landing pads.

A further aspect of the above embodiment provides that at least one of the plurality of landing pads is a ground landing pad connected to a ground line, and the conductive underfill structure directly contacts and is electrically connected to the ground landing pad.

Another further aspect of the above embodiment provides that the semiconductor die is embedded in a package body, and a redistributed layer (RDL) structure is formed over an active side of the semiconductor die, wherein the RDL structure includes connection paths that electrically connect the set of the plurality of die pads with a set of contact pads on an outer surface of the RDL structure, and the plurality of electrical connections are attached to the set of contact pads.

A further aspect of the above embodiment provides that at least one of the plurality of die pads is a ground die pad connected to a ground line, the RDL structure further includes at least one connection path that electrically connects the ground die pad with a ground contact pad on the outer surface of the RDL structure, and the conductive underfill structure directly contacts and is electrically connected to the ground contact pad.

Another aspect of the above embodiment provides that the conductive underfill structure includes a conductive polymer having an electrical conductivity greater than $1 \times 10^5$ Siemens/cm.

Another further aspect of the above embodiment provides that the conductive underfill structure further includes conductive filler or particles.

Another aspect of the above embodiment provides that the electrical isolation layer includes a dielectric material that covers the outer surface of each electrical connection from a passivated surface of the semiconductor die to a passivated surface of the carrier.

In another embodiment of the present disclosure, a method for making a packaged semiconductor device is provided, the method including: applying a dielectric encapsulant either to a plurality of electrical connections on a semiconductor die or to a set of landing pads on a carrier; performing a reflow process to attach the plurality of electrical connections to the set of landing pads, wherein the dielectric encapsulant is configured to wick away from an interface between a given electrical connection and a respective landing pad during the reflow process, and the dielectric encapsulant is further configured to cure into an electrical isolation layer that covers an outer surface of each of the plurality of electrical connections after the electrical connections are attached to the set of landing pads; and forming a conductive underfill structure between the semiconductor die and the carrier, surrounding each of the plurality of electrical connections, wherein the electrical isolation layer electrically isolates each electrical connection from the conductive underfill structure.

One aspect of the above embodiment provides that the conductive underfill structure directly contacts and is electrically connected to at least one ground pad on either the semiconductor die, the carrier, or both.

Another aspect of the above embodiment provides that the dielectric encapsulant is further configured to wick along an outer surface of the plurality of joints up to a passivated surface of the semiconductor die and down to a passivated surface of the carrier.

Another aspect of the above embodiment provides that the applying the dielectric encapsulant includes dipping or brushing the dielectric encapsulant onto the plurality of electrical connections.

Another aspect of the above embodiment provides that the applying the dielectric encapsulant includes jetting or printing the dielectric encapsulant onto the set of landing pads.

Another aspect of the above embodiment provides that the forming the conductive underfill structure includes: injecting a conductive polymer material into a space between the semiconductor die and the carrier, and curing the conductive polymer material into the conductive underfill structure.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, additional or fewer ground pads may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
   a semiconductor die;
   a carrier;
   a plurality of electrical connections formed between the semiconductor die and the carrier;
   an electrical isolation layer that covers an outer surface of each of the plurality of electrical connections; and
   a conductive underfill structure between the semiconductor die and the carrier, and surrounding each of the plurality of electrical connections, wherein the electrical isolation layer electrically isolates each electrical connection from the conductive underfill structure;
   an electrically conductive ground surface located between the semiconductor die and the conductive underfill, the electrically conductive ground surface facing the carrier, the electrically conductive ground surface is electrically coupled to a ground line of the semiconductor die, the conductive underfill structure directly contacts and is electrically connected to the electrically conductive ground surface at a location located between the semiconductor die and the carrier, wherein the electrically conductive ground surface is not part of a structure of the carrier.

2. The packaged semiconductor device of claim 1, wherein
the semiconductor die comprises a plurality of die pads connected to active circuitry within the semiconductor die.

3. The packaged semiconductor device of claim 2, wherein
each electrical connection of the plurality of electrical connections comprises:
under bump metallization (UBM) formed on each of a set of the plurality of die pads, and
a plurality of joints formed on the UBM of the set of the plurality of die pads.

4. The packaged semiconductor device of claim 2, wherein
each electrical connection of the plurality of electrical connections comprises:
a plurality of joints formed on the set of the plurality of die pads.

5. The packaged semiconductor device of claim 2, wherein
at least one of the plurality of die pads is a ground die pad connected to the ground line, and
the electrically conductive ground surface is a surface of the ground die pad.

6. The packaged semiconductor device of claim 2, wherein
at least one of the plurality of die pads is a ground die pad connected to the ground line,
under bump metallization (UBM) is formed on the ground die pad, and
the electrically conductive ground surface is a surface of the UBM.

7. The packaged semiconductor device of claim 2, wherein
each electrical connection of the plurality of electrical connections comprises:
a copper pillar formed on each of a set of the plurality of die pads, and
a solder cap formed on each copper pillar.

8. The packaged semiconductor device of claim 1, wherein
the carrier comprises a plurality of landing pads, and
the plurality of electrical connections are attached to a set of the plurality of landing pads.

9. The packaged semiconductor device of claim 8, wherein
at least one of the plurality of landing pads is a ground landing pad connected to a ground line, and
the conductive underfill structure directly contacts and is electrically connected to the ground landing pad.

10. The packaged semiconductor device of claim 2, wherein
the semiconductor die is embedded in a package body, and
a redistributed layer (RDL) structure is formed over an active side of the semiconductor die, wherein
the RDL structure comprises connection paths that electrically connect the set of the plurality of die pads with a set of contact pads on an outer surface of the RDL structure, and
the plurality of electrical connections are attached to the set of contact pads.

11. The packaged semiconductor device of claim 10, wherein
at least one of the plurality of die pads is a ground die pad connected to the ground line,
the RDL structure further comprises at least one connection path that electrically connects the ground die pad with a ground contact pad on the outer surface of the RDL structure, and
the electrically conductive ground surface is a surface of the ground contact pad.

12. The packaged semiconductor device of claim 1, wherein
the conductive underfill structure comprises a conductive polymer having an electrical conductivity greater than $1\times10^5$ Siemens/cm.

13. The packaged semiconductor device of claim 1, wherein
the conductive underfill structure further comprises conductive filler or particles.

14. The packaged semiconductor device of claim 1, wherein
the electrical isolation layer comprises a dielectric material that covers the outer surface of each electrical connection from a passivated surface of the semiconductor die to a passivated surface of the carrier.

* * * * *